United States Patent [19]

Parisi et al.

[11] Patent Number: 5,781,066

[45] Date of Patent: Jul. 14, 1998

[54] PULSE WAVEFORM GENERATOR

[75] Inventors: Samuel J. Parisi, Townsend; Edward D. Ostroff, Sudbury, both of Mass.

[73] Assignee: The Mitre Corporation, Bedford, Mass.

[21] Appl. No.: 613,477

[22] Filed: Mar. 11, 1996

[51] Int. Cl.$^6$ .................................................. H03F 3/68
[52] U.S. Cl. .......................... 330/2; 330/51; 330/124 R; 330/124 D; 330/295; 455/115
[58] Field of Search .................... 330/2, 51, 124 R, 330/124 D, 295; 332/149, 150; 342/201, 202, 173; 455/115

[56] References Cited

U.S. PATENT DOCUMENTS

| | | | |
|---|---|---|---|
| 3,421,145 | 1/1969 | Sarati | 340/147 |
| 4,148,038 | 4/1979 | Braak | 343/858 |
| 4,439,740 | 3/1984 | Harrington | 330/124 R |
| 4,560,944 | 12/1985 | Furrer | 330/10 |
| 4,580,111 | 4/1986 | Swanson | 332/41 |
| 4,718,111 | 1/1988 | Jongsma | 455/105 |
| 4,780,685 | 10/1988 | Ferguson | 330/124 D |
| 4,952,890 | 8/1990 | Swanson | 332/152 |
| 5,134,485 | 7/1992 | Binns | 358/186 |
| 5,239,275 | 8/1993 | Leitch | 332/152 |
| 5,304,943 | 4/1994 | Koontz | 330/124 R X |
| 5,309,114 | 5/1994 | Swanson | 330/10 |
| 5,325,099 | 6/1994 | Nemit et al. | 342/202 |
| 5,345,198 | 9/1994 | Jacobson | 332/152 |
| 5,381,109 | 1/1995 | Cripe et al. | 330/10 |
| 5,561,397 | 10/1996 | Kumar et al. | 330/295 |

FOREIGN PATENT DOCUMENTS 112106  9/1981  Japan ........................ 330/124 D

OTHER PUBLICATIONS

Edward D. Ostroff, et al., "Solid–State Radar Transmitters", 1985, Artech House, Inc.

*Primary Examiner*—James B. Mullins
*Attorney, Agent, or Firm*—Fish & Richardson P.C.

[57] ABSTRACT

A waveform generator is provided having a power divider for dividing power from a signal source fed thereto to a plurality of output terminals. A plurality of amplifiers is provided. A plurality of switches, each one thereof being coupled to a corresponding one of the plurality of amplifiers couples the power at the plurality of output terminals to a power combiner through a selected one, or ones of the plurality of switches and the corresponding one, or ones of the amplifiers coupled thereto, in accordance with control signals fed to the plurality of switches. A controller is provided having a shift register section. The shift register section has a plurality of successively coupled storage stages, each stage providing one of the control signals for a corresponding one of the plurality of switches. The controller, in response to a pulse duration/rise time signal, produces a sequence of control signals for the plurality of switches for increasing the number of amplifiers coupled between the power divider and power combiner during an initial period of the pulse duration, maintaining the number of amplifiers constant during a succeeding period of time, and for subsequently decreasing the number of amplifiers coupled between the power divider and power combiner during a termination period of the pulse duration.

22 Claims, 5 Drawing Sheets

PULSE WAVEFORM GENERATOR

This invention was made with Government support under Contract No. F19628-89-C-0001 awarded by the United States Air Force. The Government has certain rights in this invention.

BACKGROUND OF THE INVENTION

This invention relates generally to pulse waveform generators and more particularly to pulse waveform generators adapted for use in radio frequency energy transmitters.

As is known in the art, transmitted pulse waveforms are used in many applications. For example, they are used in radar systems to detect remote objects. The system includes a transmitter for producing a series of radio frequency energy pulses. An antenna is provided for directing the pulses towards the object. Portions of the energy reflected by the object are received by an antenna and are fed to a receiver for processing. Typically, each transmitted pulse is rectangular; that is, has a constant amplitude for a relatively short period of time. However, in some applications the amplitude of the pulse is varied over its time duration. One such system is described in U.S. Pat. No. 5,325,099, issued Jun. 28, 1994, inventors Nemit et al. In such patent, a modular solid state transmitter apparatus is used for producing waveforms whose amplitudes may vary over time. More particularly, the number of module outputs combined, and the sequence in which they are combined, are selectable. However, while such arrangement may be adequate in some applications, it provides the selective combining at the relatively high power output of the modules. Further, a relatively complex control means is described for providing the desired module output combining.

SUMMARY OF THE INVENTION

In accordance with the present invention, a waveform generator is provided having a power divider for dividing power from a signal source fed thereto to a plurality of output terminals. A plurality of amplifiers is provided. A plurality of switches, each one thereof being coupled to a corresponding one of the plurality of amplifiers couples the power at the plurality of output terminals to a power combiner through a selected one, or ones of the plurality of switches and the corresponding one, or ones of the amplifiers coupled thereto, in accordance with control signals fed to the plurality of switches. A controller is provided having a shift register section. The shift register section has a plurality of successively coupled storage stages, each stage providing one of the control signals for a corresponding one of the plurality of switches.

In accordance with another feature of the invention, the controller, in response to a pulse duration/rise time signal, produces a sequence of control signals for the plurality of switches for increasing the number of amplifiers coupled between the power divider and power combiner during an initial period of the pulse duration, maintaining the number of amplifiers constant during a succeeding period of time, and for subsequently decreasing the number of amplifiers coupled between the power divider and power combiner during a termination period of the pulse duration.

In accordance with another feature of the invention, the shift register section produces the control signals for the switches in response to clock pulses fed to such shift register section, and the controller inhibits the clock pulses from feeding the shift register section when the number of amplifiers coupled between the power divider and power combiner are maintained constant.

In accordance with still another feature of the invention, the plurality of amplifiers and switches coupled thereto are arranged in a module. The waveform generator comprises: a plurality of, M, such modules; a plurality of, M, shift register sections each one thereof being coupled to a corresponding one of the plurality of the M modules; and a divide by M divider, fed by clock pulses. A counter/selector section is fed by the divide by M divider for feeding every Mth clock pulse to a corresponding one of the M shift register sections.

In accordance with still another feature of the invention, a waveform generator is provided having: a plurality of amplifiers; a combiner for combining signals passed through the amplifiers selectively in accordance with control signals; a detector for determining a failure in one of the amplifiers; and, a controller for decoupling a detected failed one of the amplifiers from the combiner.

In accordance with still another feature of the invention, a method of operating a radio frequency transmitter is provided, such transmitter having: a plurality of amplifiers; and a controller for combining signals passed through the amplifiers selectively in accordance with control signals. The method comprises the steps of: during a test mode determining a failure in one or more of the amplifiers; and, during a normal operating mode, for decoupling a detected failed one or ones of the amplifiers from the waveform generator.

BRIEF DESCRIPTION OF THE DRAWING

Other features of the invention, as well as the invention itself, will become more readily apparent from the following description taken together with the accompanying drawings, in which.

DESCRIPTION OF THE PREFERRED EMBODIMENTS

Figure 1:
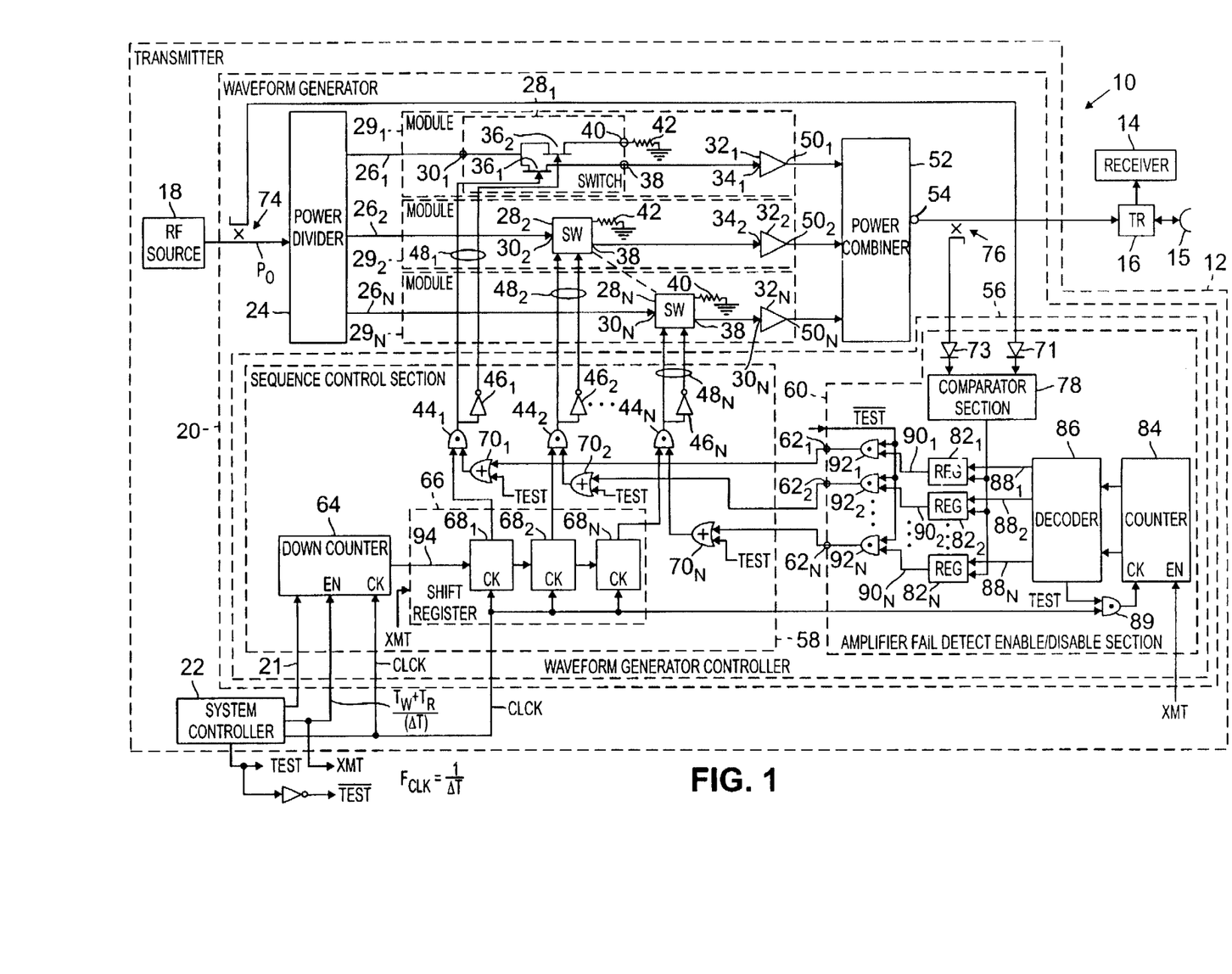
FIG. 1 is a block diagram of a radar system having a waveform generator according to the invention.

Referring now to FIG. 1, a radar system 10 is shown having a transmitter 12, a receiver 14 and an antenna 15 coupled together in a conventional manner through a transmit/receive switch 16, as shown. The transmitter 12 includes: a radio frequency source 18 for producing a radio frequency signal; a waveform generator 20; and, a system controller 22 for producing: a transmit pulse trigger signal on line XMT; a pulse width/rise time signal, here a digital word, on bus 21; clock pulses on line CLCK; a logic 1 signal on line TEST and a logic 0 signal on line $\overline{\text{TEST}}$ during a test mode; and, a logic 0 signal on line TEST and a logic 1 signal on line $\overline{\text{TEST}}$ during a normal operating mode.

The waveform generator 22 includes a power divider 24 for dividing power from the radio frequency source 18 fed thereto equally among a plurality of, here N, power divider output terminals $26_1$–$26_N$, respectively. A plurality of, here N, switches $28_1$–$28_N$, is included. Each one of the switches $28_1$–$28_N$ has an input $30_1$–$30_N$, respectively, coupled to a corresponding one of the plurality of power divider output terminals $26_1$–$26_N$, respectively, as shown. A plurality of, here N, amplifiers $32_1$–$32_N$ is included. Each one of the amplifiers $32_1$–$32_N$ has an input $34_1$–$34_N$, respectively, coupled to a corresponding one of the switches $28_1$–$28_N$, respectively, as shown. Each one of the switches $28_1$–$28_N$ and its coupled one of the amplifiers $32_1$–$32_N$, respectively, provide a corresponding one of a plurality of modules $29_1$–$29_N$, respectively, as shown.

Each one of the switches $28_1$–$28_N$ is identical in construction. An exemplary one thereof, here switch $28_1$ is shown in detail to include a pair of field effect transistors (FETs) $36_1$, $36_2$. The source electrodes of both FETs $36_1$, $36_2$ are connected to output terminal $26_1$ of the power divider 24, as shown. The drain electrode of FET $36_1$ is connected, via output 38, to the input $34_1$ of amplifier $32_1$, and the drain electrode of FET $36_2$ is connected, via output 40, to ground though a matched load 42, as shown. The gate electrode of FET $36_1$ is connected to AND gate $44_1$ and the gate electrode of FET $36_2$ is connected to AND gate 44, through inverter $46_1$, as shown. Likewise, the switches $30_2$–$30_N$ are coupled to AND gates $44_2$–$44_N$, respectively, as shown. Thus, each one of the switches $28_1$–$28_N$ is adapted to couple the power divider 24 output terminal $26_1$–$26_N$, respectively, to, or decouple it from, the input $34_1$–$34_N$, respectively, of amplifiers $32_1$–$32_N$, respectively, selectively in response to a control signal fed to the pair of FETs $36_1$, $36_2$ in such one of the switches $28_1$–$28_N$. Here, the control signal is a two bit (i.e., true and complement) signal on line pairs $48_1$–$48_N$, respectively, as shown. Considering exemplary switch $28_1$, here, when a logic 1 signal is produced by AND gate $44_1$ FET $36_1$ conducts to couple output terminal $26_1$ to the input $34_1$ of amplifier $32_1$, and the complementary logic 0 signal produced by inverter $46_1$ places FET $36_2$ in a non-conducting condition. Conversely, here, when a logic 0 signal is produced by AND gate $44_1$ FET $36_1$ is placed in a non-conducting condition to thereby decouple output terminal $26_1$ from the input $34_1$ of amplifier $32_1$, and the complementary logic 1 signal produced by inverter $46_1$, causes FET $36_2$ to conduct and therefore the output terminal $26_1$ is coupled to ground through matched load 42.

A power combiner 52 is included. The power combiner 52 is fed by outputs $50_1$–$50_N$, respectively, of the plurality of amplifiers $32_1$–$32_N$, respectively, for equally combining power fed to the power combiner 52 at the output port 54 thereof.

A waveform generator controller 56 is included for providing the control signals on line pairs $48_1$–$48_N$ for the plurality of switches $28_1$–$28_N$, respectively, as shown. More particularly, during a normal operation mode (i.e., when the logic signal on TEST line is 0 and the logic signal on $\overline{TEST}$ line is 1), and assuming that all of the amplifiers $32_1$–$32_N$ are operational, in response to a trigger pulse on line XMT and a pulse width/rise time signal representing the sum of the time duration, or pulse width, $T_W$, of the transmitted pulse and the rise time, $T_R$, of such pulse divided by the interval between clock pulses, $\Delta T$.

Figure 2:
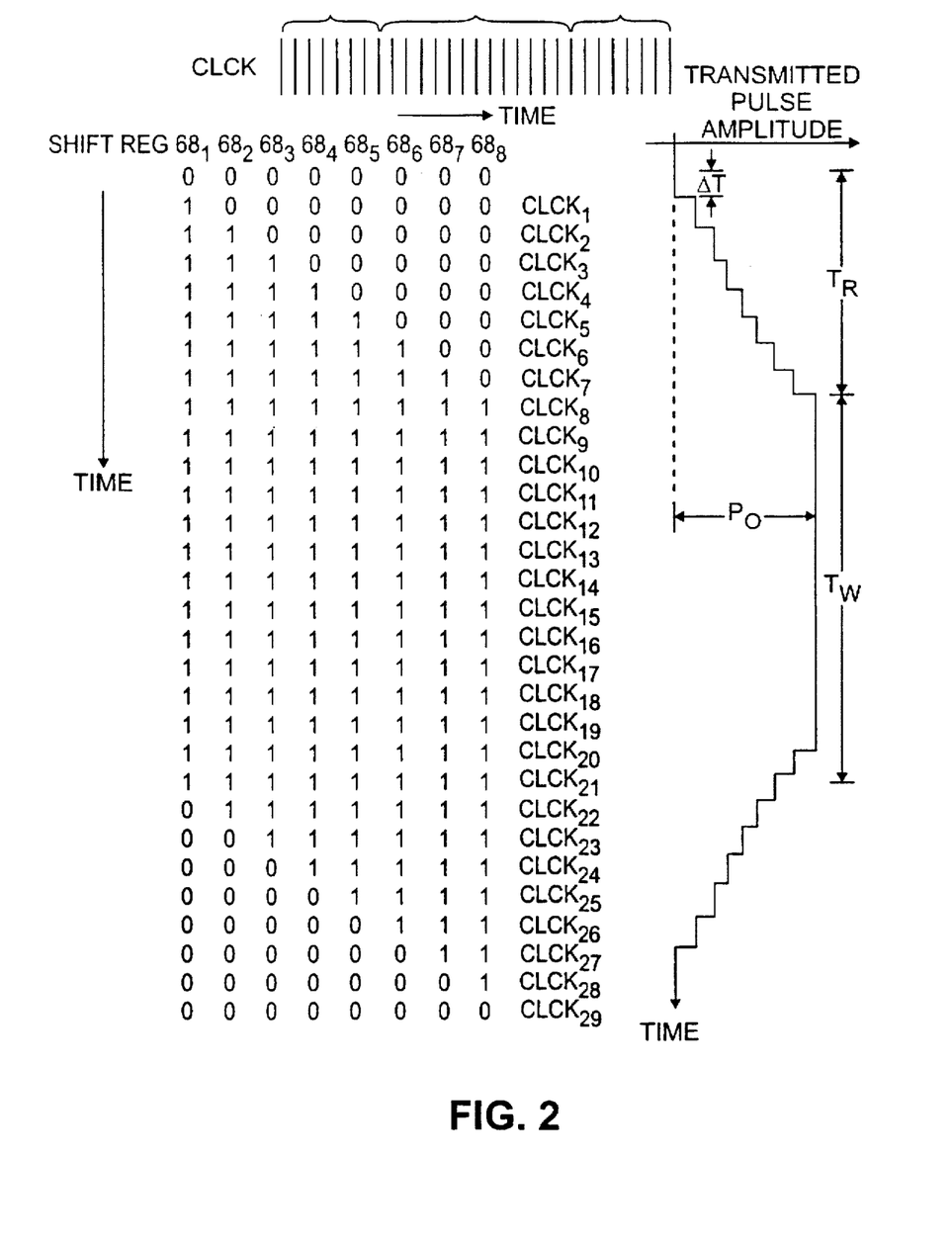
FIG. 2 shows the relationship between clock pulses fed to a shift register used in the radar system of FIG. 1 and a time history of a pulse produced by the radar system of FIG. 1 in response to the clock pulses.

Thus, after the first clock pulse, only amplifier $32_1$ is coupled to power divider 24. After the next clock pulse only amplifier $32_1$ and amplifier $32_2$ are coupled to power divider 24. In like manner, the number of amplifiers coupled to power combiner 52 continues to increase incrementally after each clock pulse for a period of time $T_R$, as shown in FIG. 2 for an example where N=8, until all of the amplifiers $32_1$–$32_N$ are coupled to power divider 24 for the period of time, $T_W$. Subsequently, after the next clock pulse, amplifier $32_1$ becomes decoupled from power divider 24. After the next clock pulse amplifiers $32_1$ and $32_2$ become decoupled from power divider 24. The process continues until, at time $T_W + 2T_R$, when all amplifiers $32_1$–$32_N$ become decoupled from the power divider 24 until a new trigger pulse XMT is produced.

More particularly, the waveform generator controller 56 includes a sequence control section 58 and an amplifier fail detect enable/disable section 60. The amplifier fail detect enable/disable section 60 will be described in detail hereinafter. Suffice it to say here, however, that during the test mode, (i.e. when the TEST line is logic 1 and the $\overline{TEST}$ line is logic 0) section 60 detects whether there are any inoperative amplifiers $32_1$–$32_N$ and, as a result of such test, logic signals are produced by section 60 on outputs $62_1$–$62_N$ to thereby cause the appropriate one, or ones, of the switches $28_1$–$28_N$ to decouple the inoperative one, or ones, of the fail detected amplifiers $32_1$–$32_N$ from the power divider 24 during the normal operating mode, in a manner to be described in detail hereinafter.

The sequence control section 58 includes a down counter 64, a shift register 66, having a plurality of successively coupled storage stages $68_1$–$68_N$ the plurality of AND gates $44_1$–$44_N$, the plurality of inverters $46_1$–$46_N$ and a plurality of OR gates $70_1$–$70_N$, all arranged as shown. More particularly, each one of the AND gates $44_1$–$44_N$ has a pair of inputs; one being fed by a corresponding one of the shift register 66 stages $68_1$–$68_N$, respectively, as shown and the other being coupled to a corresponding one of the output ports $62_1$–$62_N$, respectively, of the amplifier detect enable/disable section 60 through a corresponding one of the OR gates $70_1$–$70_N$, respectively, as shown. The second input to the OR gates $70_1$–$70_N$ is the TEST line, as shown. The output of each one of the AND gates $44_1$–$44_N$ provides one of the signals on line pairs $48_1$–$48_N$, respectively, and, after passing through inverters $46_1$–$46_N$, respectively, provides the other one of the signals on line pairs $48_1$–$48_N$, respectively, as described above.

The amplifier fail detect enable/disable section 60 includes a pair of detectors 71, 73. Detector 71 is coupled to the input of the power divider 24 through a directional coupler 74, as shown. Detector 73 is coupled to the output port 54 of the power combiner 52 though a directional coupler 76, as shown. Thus, the output of detectors 71, 73 represent the power produced at the input to the power divider 24 and the power produced at the output port 54 of the power combiner 52, respectively. The outputs of the detectors 71, 73 are fed to a comparator 78, as shown. The output of comparator 78 is fed, via line 80, to the input of a plurality of registers $82_1$–$82_N$, as shown. The amplifier fail detect enable/disable section 60 also includes a counter 84 fed by clock signals on line CLCK. The contents of the counter 84 increment in response to each one of the clock pulses on line CLCK when enabled by a logic 1 test signal produced by the system controller on line TEST during the test mode. Thus, during the test mode, the counter 84 increments in response to the clock pulses on line CLCK. A decoder 86 is provided. The decoder 86 successively enables one of its output lines $88_1$–$88_N$ in response to each clock pulse fed to counter 84. Thus, when the count of counter 84 increments from its initial reset condition of zero to one, line $88_1$ is enabled (i.e. produces a logic 1 signal) while lines $88_2$–$88_N$ remain disabled (i.e., produce logic 0 signals). In response to the next clock pulse, line $88_2$ becomes enabled (i.e., produces a logic 1 signal) while line $88_1$ and $88_3$ (not shown)-$88_N$ become disabled (i.e., produce logic 0 signals).

The output of registers $82_1$–$82_N$ provide logic signals on lines $90_1$–$90_N$, respectively, for AND gates $92_1$–$92_N$, respectively, as shown. The outputs of AND gates $92_1$–$92_N$ are fed to OR gates $70_1$–$70_N$, respectively, as shown. The TEST line is connected to each of the AND gates $92_1$–$92_N$, as shown.

In operation, a test is made to determine if one, or more of the amplifiers $32_1$–$32_N$ is inoperative. During the test mode, the logic signal on the TEST line is 1 and the logic signal on the $\overline{\text{TEST}}$ line is 0. Thus, OR gates $70_1$–$70_N$ which have one input thereof coupled to the TEST line, produce logic 1 signals for AND gates $44_1$–$44_N$ while AND gates $92_1$–$92_N$ produce logic 0 signals thereby decoupling the outputs $62_1$–$62_N$ of amplifier fail detect enable/disable section 60 from the sequence controller section 58 during the test mode. Further, down counter 64 is loaded with a count of one on the DATA WORD bus and the contents of the shift register 66 and the counter 84 are reset to zero in response to the trigger pulse on line XMT. Down counter 64 will produce a logic 1 on output line 94 thereof until it counts down to zero at which time the output line 94 thereof will produce a logic 0.

It is noted that an AND gate 89 is provided. One input of the AND gate 89 is coupled to the TEST line and the other input is coupled to the CLCK line. The output of the AND gate 89 is fed to the clock input of counter 84. Thus, counter 84 counts clock pulses only during the test mode (i.e., when the TEST line produces a logic 1).

Continuing with the test mode operation, in response to the next clock signal on line CLCK, the logic 1 loaded into the down counter 64 during the test mode, becomes stored in the first stage $68_1$ of the shift register 66. Further, because the logic signal on the TEST line is 1, OR gates $70_1$–$70_N$ produce logic 1 signals which pass to AND gates $44_1$–$44_N$. Thus, during the test mode, the logic states stored in stages $68_1$–$68_N$ pass through AND gates $44_1$–$44_N$, respectively. It follows then that the logic 1 signal now stored in stage $44_1$ enables switch $28_1$ to couple only amplifier $32_1$ to power divider 24. Comparator 78 produces a logic 1 signal if power fed thereto via coupler 76 is above a predetermined threshold relative to the power fed thereto via coupler 74 thereby indicating that amplifier $32_1$ is operative; otherwise, if the power fed to the comparator 78 via coupler 76 is below the predetermined threshold level relative to the power fed thereto via coupler 74 thereby indicating that amplifier $32_1$ is inoperative (i.e., failed). It is also noted that during this period of time, the count in counter 84 is allowed to be incremented in response to the clock pulses on line CLCK by enabled AND gate 89. Thus, after being incremented by one, line $88_1$ is enabled (all other lines $88_3$–$88_N$ are disabled) as discussed above. Consequently, the logic state of the signal produced on output line 80 of comparator 78 becomes stored in register $82_1$ (i.e., a logic 1 if the amplifier $32_1$ is operative and a logic 0 if amplifier $32_1$ is inoperative).

In response to the next clock pulse on line CLCK during the test mode, the contents of down counter 64 decrements by one to store zero. Thus, the contents of stage $68_1$ of shift register 66 returns to logic 0 while the logic 1 previously stored therein shifts for storage in stage $68_2$. Thus, amplifier $32_1$ (along with decoupled amplifiers $32_3$ (not shown)-$32_N$ become decoupled from the power divider 24 while only amplifier $32_2$ becomes coupled to power divider 24. Further, the counter 84 increments by one to two. Thus, line $88_2$ is enabled while lines $88_1$ and $88_2$–$88_N$ are disabled. That is, because only AND gate $44_2$ of AND gates $44_1$–$44_N$ produces a logic 1, the power from source 18 fed to power divider 24 is fed only to amplifier $32_2$. If such amplifier $32_2$ is functioning properly, a proper power again appears at the output of power combiner 52. Therefore, comparator section 78 produces a logic 1 on line 80 which is stored in enabled register $82_2$; all other registers $82_1$ and $82_3$–$82_N$ being disabled by non-enabled lines $88_1$ and $88_3$–$88_N$ respectively. Conversely, if amplifier $32_2$ is inoperative, a logic 0 produced on line 80 is stored in register $82_2$. It follows then that as the process continues, at the end of the test mode, the registers $82_1$–$82_N$ storing logic 1 indicate that the amplifiers $32_1$–$32_N$, respectively, are functioning properly; whereas, the registers $82_1$–$82_N$ storing logic 0 indicate that the amplifiers $32_1$–$32_N$, respectively, have failed.

During the normal operating mode, i.e., when the signal on TEST line is logic 0 and the signal on line $\overline{\text{TEST}}$ is logic 1, the AND gates $92_1$–$92_N$ pass the logic states stored in registers $82_1$–$82_N$, to outputs $62_1$–$62_N$, respectively, of the amplifier fail detect enable/disable section 60. Thus, because the logic signal on the TEST line is now 0, only those OR gates $70_1$–$70_N$ coupled to AND gates $92_1$–$92_N$ storing logic 1 signals will produce logic 1 signals. Further, during the normal operation mode, the pulse width/rise time word, $T_W+T_R$, produced by system controller 22 on the pulse width/rise time bus 21 is the desired pulse width plus rise time, $T_W+T_R$, described above, rather than the one produced during the above described test mode. Thus, in response to the pulse duration/rise time signal, $T_W+T_R$, on the bus 21, a sequence of control signals is produced on line pairs $48_1$–$48_N$ for the plurality of switches $28_1$–$28_N$, respectively to generate the above described waveform. More particularly, in response thereto, during an initial, rise time period of the pulse duration, $T_R$, successively increasing the number of amplifiers $32_1$–$32_N$ coupled to the power divider 24 in response to each successive clock pulse on line CLCK; during the next period of time, $T_R$ to $T_R+T_W$, the pulse of duration $T_W$ is produced and, during a terminal period, $T_R+T_W$ to $2T_R+T_W$, successively decreasing the number of amplifiers $32_1$–$32_N$ coupled to the power divider 24 in response to each successive clock pulse on line CLCK, as shown in FIG. 2, for an example where N=8, $T_R$=N($\Delta$T)=8 ($\Delta$T), and $T_W$=14($\Delta$T).

More particularly, during normal operation, the signal on the line TEST is logic 0 and the signal on line $\overline{\text{TEST}}$ is logic 1. Thus, during normal operation, the OR gates $70_1$–$70_N$ produce logic signals representative of the logic signal stored in registers $82_1$–$82_N$, respectively. Further, the counter 84 is disabled by AND gate 89 so that the contents of registers $82_1$–$82_N$ will remain unchanged during the normal, non-test mode and none of the lines $88_1$–$88_N$ will be enabled. Therefore, if any one, or ones, of the amplifiers $32_1$–$32_N$ have failed, the OR gates $70_1$–$70_N$ respectively, will cause the AND gates $44_1$–$44_N$, respectively, coupled thereto to produce a logic 0 signal resulting in the appropriate inoperative amplifiers $32_1$–$32_N$ being decoupled from the power divider 24. For example, assume amplifiers $32_2$ and $32_N$ were found inoperative during the test mode. In such case, registers $82_2$ and $82_N$ would store logic 0 while all the other registers would store logic 1. Consequently, AND gates $44_2$, and $44_N$ would produce logic 0 signals resulting in switches $28_2$ and $28_N$ decoupling amplifiers $32_2$ and $32_N$ from the power combiner 24 during the normal operating mode. That is, output terminals $26_2$ and $26_N$ would be coupled to ground through matched loads 42 and amplifiers $32_2$ and $32_N$ would be decoupled from the waveform generator 20.

Thus, during normal operation, and now assuming all amplifiers $32_1$–$32_N$ were found operative in the previous test mode, the contents of the down counter 64 is initially reset to 0. Thus, a logic 0 signal is produced on its output line 94. Also, the contents in the shift register 66 is reset to 0. Thus, each one of the stages $68_1$–$68_N$ stores a logic 0 signal. The logic 0 signal produced by stages $68_1$–$68_N$ result in AND gates $44_1$–$44_N$ producing logic 0 signals and inverters $46_1$–$46_N$ producing logic 1 signals. In response to the logic 0 signal produced by AND gates $44_1$–$44_N$, the output terminals $26_1$–$26_N$ of power divider 24 are coupled to matched loads 42 by switches $28_1$–$28_N$, respectively. Thus, the radio frequency source 18 is decoupled from the power combiner 52 and the power output of the power combiner 52 is zero.

Next, a digital word representative of the desired pulse width/rise time, $T_W+T_R$, is produced by the system controller 22 and is loaded into the down counter 64 in response to the transmit trigger pulse on line XMT. The non-zero contents of the counter 64 produces a logic 1 at its output line 94. Further, in response to the transmit trigger pulse on line XMT, the down counter 64 is enabled and counts down incrementally in response to each clock pulse on line CLCK. Thus, a logic 1 is produced on counter 64 output line 94 until the contents of counter 64 reaches zero at which time the signal on counter 64 output line 94 returns to logic 0.

Thus, referring also to FIG. 1, the clock signal on line CLCK is fed to each of the stages $68_1$–$68_N$ of the shift register 66. The logic signal on counter 64 output line 94 is fed to the first stage $68_1$ of the shift register 66, as shown. In response to the next clock pulse on line CLCK, the logic 1 on line 94 becomes stored in stage $68_1$. Therefore, the output $26_1$ of power divider 24 is coupled to the input $34_1$ of amplifier $32_1$ resulting in the power at the output of power combiner 52 to increase by $P_o/N$, where $P_o$ is the output power at the output of power combiner 52.

In response to the next clock pulse on line CLCK, the logic 1 on line 94 again becomes stored in stage $68_1$ while the logic 1 previously stored in stage $68_1$ becomes stored in stage $68_2$. Thus, power at the output of power combiner 52 increases to $2P_o/N$. The process continues until, at time $T_R$, the full power at the input to power divider 24 becomes coupled to the output of power combiner 52 assuming all amplifiers $32_1$–$32_N$ are operative.

When the contents of the down counter 64 reaches zero, at time $T_R+T_W$, a logic 0 signal is produced on line 94. During the next clock pulse on line CLCK, the logic 0 on line 94 becomes stored in stage $68_1$, thereby decoupling the input $34_1$ of amplifier $32_1$, from the output $26_1$, of power divider 24 resulting in a decrease in power at the output of power combiner 52 from $P_o$ to $[(N-1)/N]P_o$. The process continues until the inputs $34_1$–$34_N$ of the plurality of amplifiers $32_1$–$32_N$ are decoupled from the outputs $26_1$–$26_N$ of the power divider 24. The process repeats in response to the next transmit trigger pulse on line XMT.

As noted above, if during the initial test mode any one or ones of the amplifiers $32_1$–$32_N$ were found inoperative, such one or ones of the inoperative amplifiers would not have passed power and the output power at output terminal 54 would be reduced by $P_o/N$ times the number of inoperative amplifiers.

It should noted that the test mode may be performed either during the start of the normal operating mode or also during the interval prior to each transmitted pulse. That is, during each normal operating mode used to produce each transmitted pulse, the detected failed one or ones of the amplifiers are decoupled from the waveform generator. Thus, the test modes may interleaved with normal operating modes.

Figure 3:
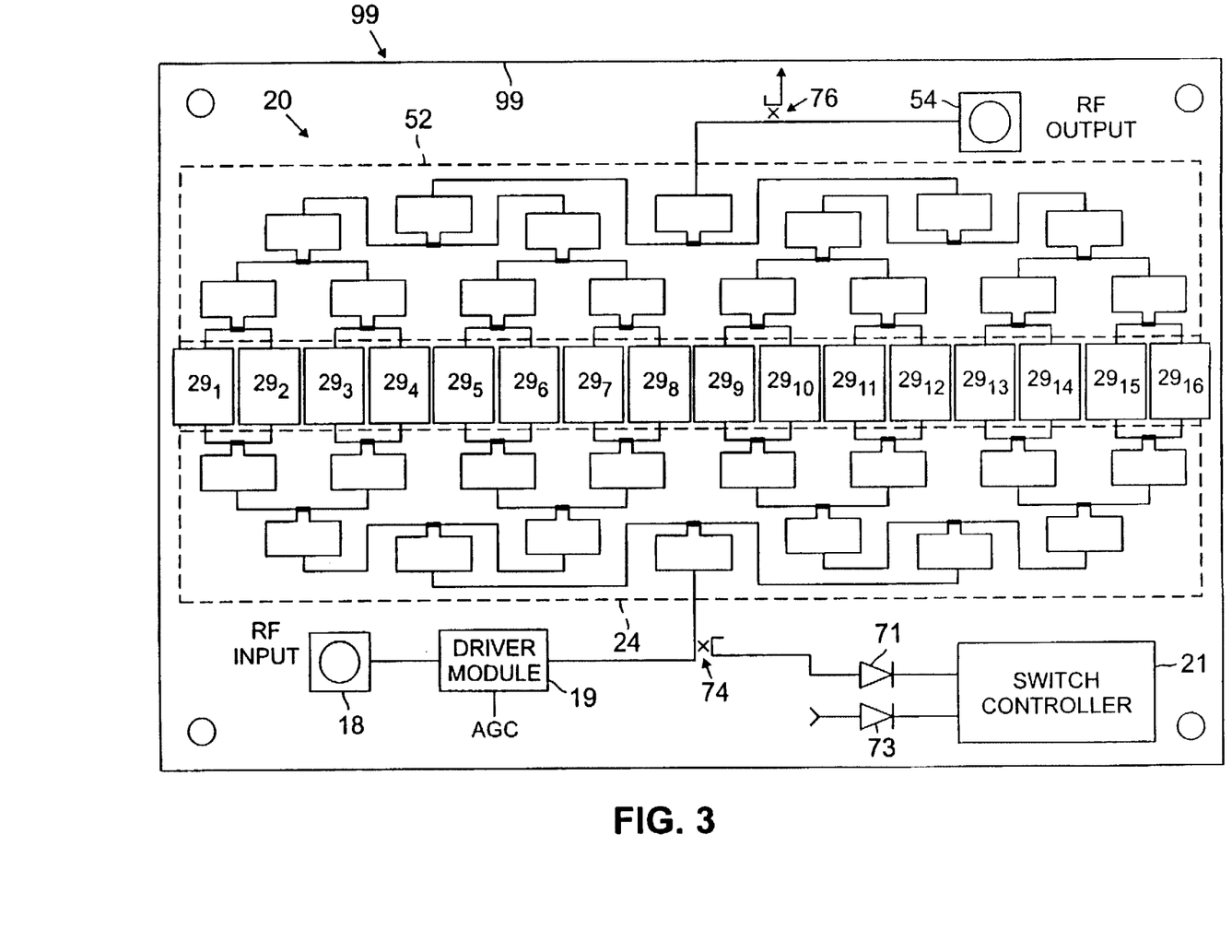
FIG. 3 is a drawing showing the waveform generator of FIG. 1 in a package according to the invention.

Referring now to FIG. 3, a package 99 is shown having the radar system transmitter 12 discussed above in connection with FIG. 1 packaged therein. Here, an AGC 19 is included. The switch controller 21 includes the system controller 22 (FIG. 1), the sequence control section 58 (FIG. 1), and the amplifier fail detect enable/disable section 60 (FIG. 1). Also included are the plurality of amplifiers $32_1$–$32_N$, respectively with its coupled one of the switches $28_1$–$28_N$. Here, each one of the amplifiers $32_1$–$32_N$ and the one of the switches $28_1$–$28_N$, coupled thereto, are designated as modules $29_1$ through $29_N$, respectively in FIG. 3. Here, N=16. Also included is the power divider 24 and the power combiner 52. Thus, here again, the packaged waveform generator 20, in response to a pulse duration signal, and a trigger signal, produces a sequence of control signals for the plurality of switches which successively increase the number of amplifiers coupled to the power divider during an initial period of the pulse duration and which successively decreases the number of amplifiers coupled to the power divider during a terminal period of the pulse duration. Further, detectors 71, 73 are provided for, with switch controller 21, determining a failure in one of the amplifiers during a test mode and for decoupling a detected failed one or ones of the amplifiers from the combiner during a normal operating mode.

Figure 4:
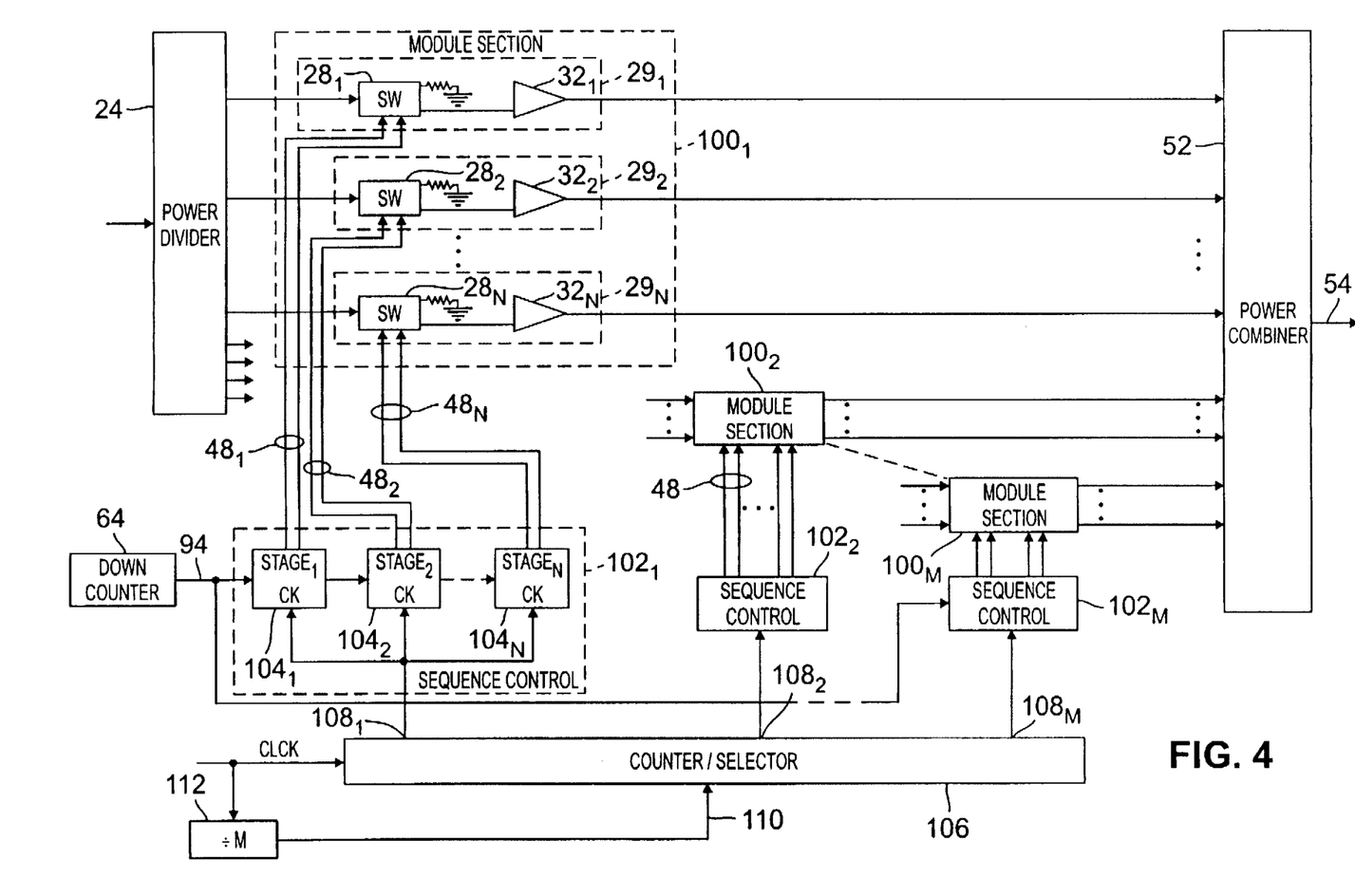
FIG. 4 is a block diagram of a waveform generator according to an alternative embodiment of the invention.

Referring now to FIG. 4, an alternative embodiment of the invention is shown. Here, the N amplifiers $32_1$–$32_N$ and their associated switches $28_1$–$28_N$, (i.e., modules $29_1$–$29_N$) respectively, are arranged in a module section $100_1$. Here, a plurality of M such module sections $100_1$–$100_M$ are provided, as shown. Each one of the module sections $100_1$–$100_N$ is coupled to a corresponding sequence control $102_1$–$102_M$, respectively, as shown. Each one of the sequence controls $102_1$–$102_M$ is identical in construction. An exemplary one thereof, here sequence control $102_1$ is shown to include N successively coupled stages $104_1$–$104_N$, as shown. Each one of such stages $104_1$–$104_N$ includes a storage stage such as stage $68_1$ in FIG. 1, an AND gate, such as AND gate $44_1$ in FIG. 1, an OR gate, such as OR gate $70_1$ in FIG. 1 and an inverter such as inverter $46_1$ shown in FIG. 1, all arranged as shown in FIG. 1 to produce the signals on line pairs $48_1$–$48_N$, as described above in connection with FIG. 1. Here, a counter/selector 106 is provided. The counter/selector 106 is fed the clock pulses on line CLCK, as described in connection with FIG. 1. The clock pulses on line CLCK are distributed to output ports $108_1$–$108_M$ selectively in accordance with the number of pulses produced on line 110. The signal on line 110 is produced by a divide by M divider 112. The divide by M divider is fed clock pulses on line CLCK. Thus, one pulse is produced on line 110 after each group of M sequential clock pulses on line CLCK. The pulses on line 110 are counted by counter/selector 106 and the clock pulse on line CLCK fed to counter/selector 106 is distributed to outputs $108_1$–$108_N$ selectively in accordance with the count.

More particularly, the first clock pulse on line CLCK is coupled to port $108_1$, the next clock pulse is coupled to port $108_2$, and so forth until the Mth clock pulse is coupled to port $108_M$ after which the next clock pulse is again coupled to port $108_1$. The process repeats so that any one of the ports $108_1$–$108_M$ receives clock pulses at (1/M)th the rate at which the clock pulses are produced on line CLCk. Further, the amplifiers are incrementally added (i.e., coupled) to, or subtracted (i.e., decoupled) from, the power divider 24 once every clock pulse, assuming all amplifiers in each one of the M module sections $100_1$–$100_M$ are operative.

Figure 5:
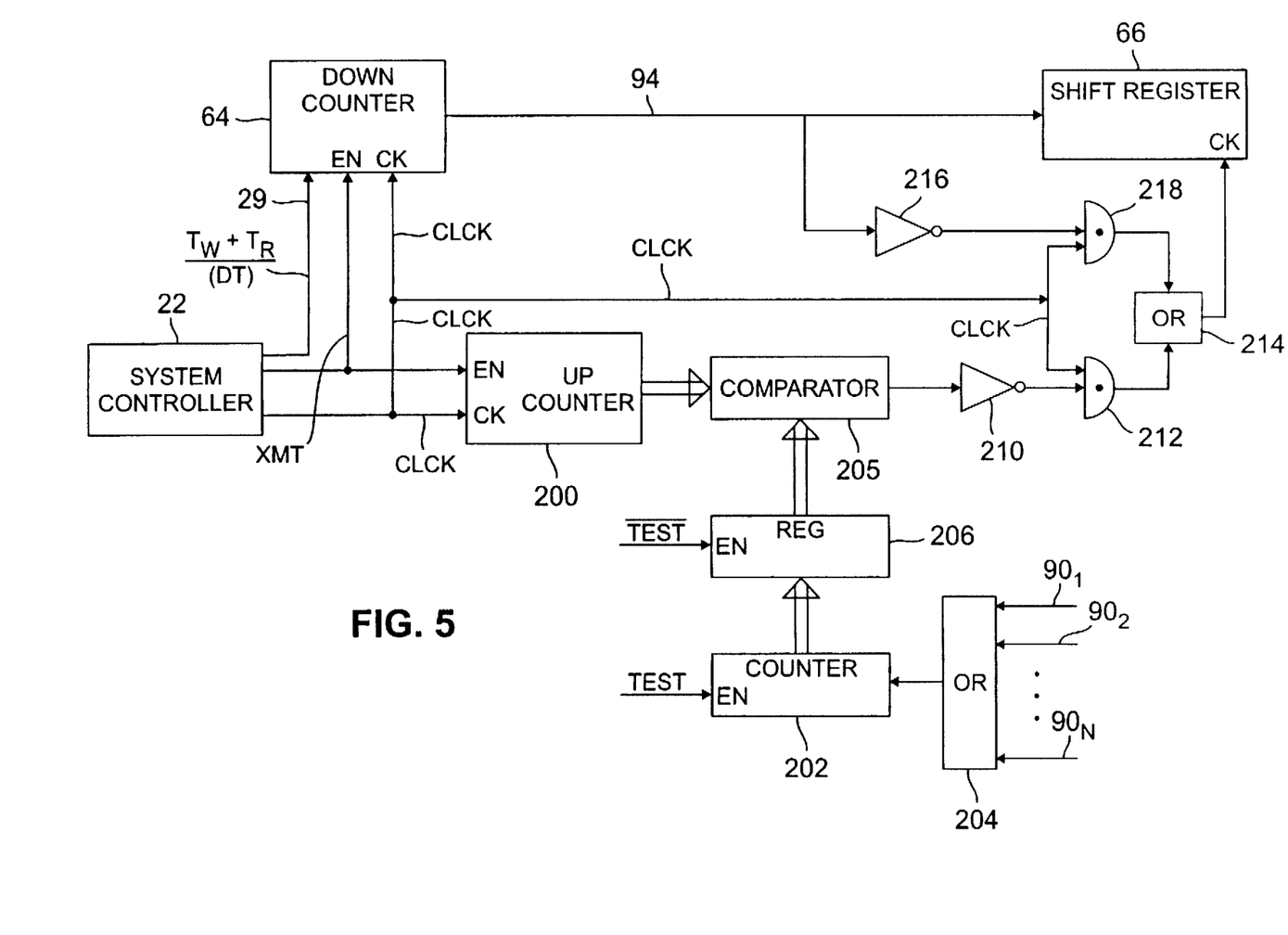
FIG. 5 is a block diagram of a portion of a controller used in the radar system of FIG. 1 in accordance with an alternative embodiment of the invention.

Referring now to FIG. 5, a portion of controller 56, FIG. 1, is modified. More particularly, instead of feeding clock pulses to the shift register 66 during the period of time $T_R$ to $T_R+T_W$ (FIG. 2), that is during the time the transmitted pulse has a constant amplitude, (FIG. 2), clock pulses are inhibited from passing to the clock input CK of the shift register. As shown in FIG. 5, the clock pulses produced by system controller 22 are fed to an up-counter 200. The up-counter 200 is enabled by the XMT pulse produced by the system controller 22. During the test mode, a second counter 202 counts the number of operative amplifiers $32_1$–$32_N$. More particularly, each time a logic 1 is produced on lines $90_1$–$90_N$, such logic 1 passes through OR gate 204 and is counted in counter 202. After the test mode, i.e., during the normal operating mode, the count of operative amplifiers $32_1$–$32_N$ in counter 202 is stored in a register 206. During the normal operating mode, the contents of the register 206 and the count in counter 200 are compared in comparator 205. If the count in counter 200 is less than the count in register 206, the comparator 205 produces a logic 0. Thus, in such condition, (i.e. during the rise time, $T_R$, inverter 210 enables AND gate 212 and clock pulses are allowed to pass through AND gate 212 and OR gate 214 to the clock input CK of the shift register. (It should be noted that during the rise time and pulse width time, i.e., $T_R+T_W$, the down counter 64 produces a logic 1 which, because of inverter 216 disables AND gate 218). Thus, because of enabled AND gate 212, clock pulses are fed to the shift register during the rise time, $T_R$, of the pulse.

When the count in register 206 is equal to or greater than the contents of counter 200, i.e., during the time period the transmitted pulse has its constant amplitude, FIG. 2, the comparator 205 produces a logic 1 and because of inverter 210, disables AND gate 212; it being noted that during this period of time that the transmitted pulse has its constant amplitude, FIG. 2, inverter 216 disables AND gate 218. Therefore, during the period of time that the transmitted pulse has its constant amplitude, FIG. 2, clock pulses are not fed to the shift register 66 and the contents thereof remain unchanged.

At the time the down counter 64 counts to $T_R+T_W$, its output changes from logic 1 to logic 0 thereby, via inverter 216, enabling AND gate 218 so that clock pluses are again fed to the clock input CK of the shift register 66 to incrementally reduce the level of the transmitted pulse. With this arrangement, high frequency pulses are not coupled to the shift register during the time the transmitted pulse is in its active, i.e., constant amplitude, phase.

Other embodiments are within the spirit and scope of the appended claims.

What is claimed is:

1. A waveform generator, comprising:
    a power divider for dividing power from a signal source fed thereto to a plurality of output terminals;
    a plurality of amplifiers;
    a power combiner for combining power fed thereto;
    a plurality of switches, each one thereof being coupled to a corresponding one of the plurality of amplifiers, for coupling the power at the plurality of output terminals to the power combiner through a selected one, or ones of the plurality of switches and the corresponding one, or ones of the amplifiers coupled thereto, in accordance with control signals fed to the plurality of switches;
    a controller, comprising a shift register section having a plurality of successively coupled storage stages, each stage providing one of the control signals for a corresponding one of the plurality of switches.

2. The waveform generator recited in claim 1 wherein the controller, in response to a pulse duration/rise time signal, produces a sequence of control signals for the plurality of switches for increasing the number of amplifiers coupled between the power divider and power combiner during an initial period of the pulse duration, maintaining the number of amplifiers constant during a succeeding period of time, and for subsequently decreasing the number of amplifiers coupled between the power divider and power combiner during a termination period of the pulse duration.

3. The waveform generator recited in claim 2 wherein the shift register section produces the control signals for the switches in response to clock pulses fed to such shift register section, and wherein the controller inhibits the clock pulses from feeding the shift register section when the number of amplifiers coupled between the power divider and power combiner are maintained constant.

4. The waveform generator recited in claim 1 wherein the plurality of amplifiers and switches coupled thereto are arranged in a module, such waveform generator comprising:
    a plurality of, M, modules;
    a plurality of, M, shift register sections each one thereof being coupled to a corresponding one of the plurality of the M modules; and
    a divide by M divider, fed by clock pulses;
    a counter/selector section fed by the divide by M divider for feeding every Mth clock pulse to a corresponding one of the M shift register sections.

5. A waveform generator, comprising:
    a power divider for dividing power;
    a plurality of switches;
    a power combiner for combining power fed thereto;
    a plurality of amplifiers, each one thereof being coupled to a corresponding one of the plurality of switches;
    a controller for providing the control signal for the plurality of switches;
    wherein each one of the switches is adapted to couple the corresponding one of the amplifiers between the power divider and the power combiner or decouple the corresponding one of the amplifiers from between the power divider and the power combiner selectively in accordance with a control signal; and
    wherein the controller includes a shift register section having a plurality of successively coupled storage stages, each stage providing the control signal for a corresponding one of the plurality of switches.

6. The waveform generator recited in claim 5 wherein the controller, in response to a pulse duration/rise time signal, produces a sequence of control signals for the plurality of switches for increasing the number of amplifiers coupled to the power divider during an initial period of the pulse duration, maintaining the number of amplifiers constant during a subsequent period of time, and for then decreasing the number of amplifiers coupled to the power divider during a termination period of the pulse duration.

7. The waveform generator recited in claim 6 wherein the shift register section produces the control signals for the switches in response to clock pulses fed to such shift register section, and wherein the controller inhibits the clock pulses from feeding the shift register section when the number of amplifiers coupled between the power divider and power combiner are maintained constant.

8. The waveform generator recited in claim 5 wherein the plurality of amplifiers and switches coupled thereto are arranged in a module, such waveform generator comprising:
    a plurality of, M, modules;
    a plurality of, M, shift register sections each one thereof being coupled to a corresponding one of the plurality of the M modules; and a divide by M divider, fed by clock pulses;

a counter/selector section fed by the divide by M divider for feeding every Mth clock pulse to a corresponding one of the M shift register sections.

9. A waveform generator, comprising:

a plurality of amplifiers;

a power combiner for combining signals passed through the amplifiers selectively in accordance with control signals;

a detector for determining a failure in one of the amplifiers; and a controller for decoupling a detected failed one of the amplifiers from the combiners;

a power divider for dividing power from a signal source fed thereto to a plurality of output terminals;

a plurality of switches, each one thereof having:

an input coupled to a corresponding one of the plurality of power divider output terminals, each one of the plurality of amplifiers having an input coupled to an output port of a corresponding one of the switches;

wherein each one of the switches is adapted to couple the power divider output terminal coupled thereto to, or decouple such output terminal from, the amplifier coupled to such switch selectively in response to a control signal;

wherein the power combiner is fed by outputs of the plurality of amplifiers for combining power fed to the power combiner at an output port thereof;

wherein the controller provides the control signals for the plurality of switches; and wherein the controller, in response to a pulse duration/rise time signal, produces a sequence of control signals for the plurality of switches for increasing the number of amplifiers coupled to the power divider during an initial period of the pulse duration, maintaining the number of amplifiers constant during a subsequent period of time, and for then decreasing the number of amplifiers coupled to the power divider during a termination period of the pulse duration.

10. The waveform generator recited in claim 9 wherein the controller comprises a shift register having a plurality of successively coupled storage stages, each stage providing the control signal for a corresponding one of the plurality of switches.

11. A transmitter, comprising:

a package; and, a waveform generator stored in such package, the waveform generator comprising:

a power divider for dividing power from a signal source fed thereto to a plurality of output terminals;

a plurality of switches, each one thereof having an input coupled to a corresponding one of the plurality of power divider output terminals;

a plurality of amplifiers, each one having an input coupled to an output terminal of a corresponding one of the switches;

a power combiner; and a controller for providing control signals for the plurality of switches in response to a pulse duration/rise time signal, to produce a sequence of control signals for the plurality of switches for increasing the number of amplifiers coupled between the power divider and power combiner during an initial period of the pulse duration, maintaining the number of amplifiers constant during a succeeding period of time, and for subsequently decreasing the number of amplifiers coupled between the power divider and power combiner during a termination period of the pulse duration.

12. The transmitter recited in claim 11 wherein each one of the switches is adapted to couple the power divider output terminal coupled thereto to, or decouple such output terminal from, the amplifier coupled to such switch selectively in response to a control signal.

13. The transmitter recited in claim 12 wherein the power combiner is fed by outputs of the plurality of amplifiers for combining the power fed thereto.

14. The transmitter recited in claim 13 wherein the controller provides the control signal for the plurality of switches.

15. The waveform generator recited in claim 11 wherein the controller comprises a shift register having a plurality of successively coupled storage stages, each stage providing the control signal for a corresponding one of the plurality of switches.

16. The transmitter recited in claim 11 including a detector for determining a failure in one of the amplifiers; and, a controller for decoupling a detected failed one of the amplifiers from the combiner.

17. A waveform generator, comprising:

a power divider for dividing power from a signal source fed thereto to a plurality of output terminals;

a plurality of amplifiers;

a power combiner for combining power fed thereto;

a plurality of switches, each one thereof being coupled to a corresponding one of the plurality of amplifiers, for coupling the power at the plurality of output terminals to the power combiner through a selected one, or ones of the plurality of switches and the corresponding one, or ones of the amplifiers coupled thereto, in accordance with control signals fed to the plurality of switches;

a controller for providing control signals for the plurality of switches in response to a pulse duration/rise time signal, to produce a sequence of control signals for the plurality of switches for increasing the number of amplifiers coupled between the power divider and power combiner during an initial period of the pulse duration, maintaining the number of amplifiers constant during a succeeding period of time, and for subsequently decreasing the number of amplifiers coupled between the power divider and power combiner during a termination period of the pulse duration.

18. The waveform generator recited in claim 17 wherein the plurality of amplifiers and switches coupled thereto are arranged in a module, such waveform generator comprising:

a plurality of, M, modules;

a plurality of, M, shift register sections each one thereof being coupled to a corresponding one of the plurality of the M modules; and a divide by M divider, fed by clock pulses;

a counter/selector section fed by the divide by M divider for feeding every Mth clock pulse to a corresponding one of the M shift register sections.

19. The waveform generator recited in claim 18 wherein the shift register section produces the control signals for the switches in response to clock pulses fed to such shift register section, and wherein the controller inhibits the clock pulses from feeding the shift register section when the number of amplifiers coupled between the power divider and power combiner are maintained constant.

20. A waveform generator, comprising:

a power divider for dividing power;

a plurality of switches;

a power combiner for combining power fed thereto;

a plurality of amplifiers, each one thereof being coupled to a corresponding one of the plurality of switches;

a controller for providing the control signal for the plurality of switches;

wherein each one of the switches is adapted to couple the corresponding one of the amplifiers between the power divider and the power combiner or decouple the corresponding one of the amplifiers from between the power divider and the power combiner selectively in accordance with a control signal; and wherein the controller provides the control signal for the plurality of switches in response to a pulse duration/rise time signal to produce a sequence of control signals for the plurality of switches for increasing the number of amplifiers coupled to the power divider during an initial period of the pulse duration, maintaining the number of amplifiers constant during a subsequent period of time, and for then decreasing the number of amplifiers coupled to the power divider during a termination period of the pulse duration.

21. The waveform generator recited in claim 20 wherein the plurality of amplifiers and switches coupled thereto are arranged in a module, such waveform generator comprising:

a plurality of, M, modules;

a plurality of, M, shift register sections each one thereof being coupled to a corresponding one of the plurality of the M modules; and a divide by M divider, fed by clock pulses;

a counter/selector section fed by the divide by M divider for feeding every Mth clock pulse to a corresponding one of the M shift register sections.

22. The waveform generator recited in claim 21 wherein the shift register section produces the control signals for the switches in response to clock pulses fed to such shift register section, and wherein the controller inhibits the clock pulses from feeding the shift register section when the number of amplifiers coupled between the power divider and power combiner are maintained constant.

* * * * *